United States Patent [19]
Johnson et al.

[11] Patent Number: 5,686,152
[45] Date of Patent: Nov. 11, 1997

[54] METAL INITIATED NUCLEATION OF DIAMOND

[76] Inventors: Linda F. Johnson, 1124 Yosemite La., Ridgecrest, Calif. 95555; Karl A. Klemm, 665 Crescent Dr., Largo, Fla. 34640; Mark B. Moran, 1124 Yosemite La., Ridgecrest, Calif. 93555

[21] Appl. No.: 530,388
[22] Filed: Aug. 3, 1995
[51] Int. Cl.$^6$ ................................................ C23C 16/26
[52] U.S. Cl. ............................................ 427/577; 427/249
[58] Field of Search ................................... 427/577, 534, 427/249, 122, 282; 423/446

[56] References Cited

U.S. PATENT DOCUMENTS

| | | | |
|---|---|---|---|
| 5,124,179 | 6/1992 | Garg et al. | 427/249 |
| 5,169,676 | 12/1992 | Moran et al. | 427/575 |
| 5,169,976 | 12/1992 | Moran et al. | 427/575 |
| 5,183,685 | 2/1993 | Yamazaki | 427/571 |
| 5,382,293 | 1/1995 | Kawarada et al. | 118/723 DC |
| 5,491,002 | 2/1996 | Slutz | 427/249 |

*Primary Examiner*—Shrive Beck
*Assistant Examiner*—Timothy Meeks
*Attorney, Agent, or Firm*—Stephen J. Church; Melvin J. Sliwka

[57] ABSTRACT

Nucleation of diamond crystallites is initiated on electrically nonconducting substrates and on semiconducting substrates at a temperatures of 650° C. or lower by providing atoms of a metal in a plasma formed by activation, as by microwave energy in a vacuum chamber, of a mixture of hydrogen and a carbon containing vapor. A continuous, adhering film of polycrystalline diamond is then grown on the substrate from the nucleated crystallites. The nucleation is effective when the substrate has a positive electric potential relative to a wall of the chamber. Positive and negative dopants may be provided in the vapor to give a semiconducting film. The nucleation and film growth are effective at the relatively low substrate temperatures so that dopant diffusion and substrate damage occurring at the usual, higher diamond film deposition temperatures are avoided. Atoms of chromium, titanium, and nickel are particularly effective and may be provided by a metalorganic compound in the vapor or by a solid material which is etched by the plasma and may be the pure metal or its oxide, nitride, or alloy. The solid material may be provided as an open vessel or on a ring within which the substrate is placed or as a coating deposited on the substrate. A partial coating of the solid material results in the diamond film being selectively deposited only on the uncoated portion.

9 Claims, No Drawings

METAL INITIATED NUCLEATION OF DIAMOND

BACKGROUND OF THE INVENTION

1. Field of the Invention

The present invention pertains to coating processes using catalyzed vapor deposition of diamond.

2. Description of the Prior Art

The use of the carbon allotrope diamond is highly desirable as a temperature and impact resistive coating for optical articles, as a protective and yet heat conductive coating for electronic devices, as a low friction coating, and as a coating for cutting tools: and the development of chemical vapor deposition (CVD) for diamond films from a carbon containing plasma has resulted in the practical application of diamond for these uses. However, CVD of diamond films in accordance with the prior art is, in general, only effective on electrically conducting or semiconducting materials, and attempted CVD deposition of diamond on a nonconducting material, such as silica as shown by examples below, does not result in a continuous adhering film of diamond even if the nonconducting material is abraded or seeded with diamond. Even on materials on which the prior art deposition is effective, such as silicon, or potentially effective, such as doped diamond for semiconducting use or carbide cutting tools with a metal binder, the prior art temperatures of 850°–1100° C. damage many potentially desirable substrate materials and result in the diffusion of dopants from deposited diamond and the diffusion of deleterious materials from the substrate into the diamond. It is thus highly desirable to provide a diamond deposition method which extends the benefits of diamond films to electrically nonconducting materials as well as other materials on which CVD of diamond is impractical due to the necessary prior art temperatures.

SUMMARY OF THE INVENTION

The present invention provides for the deposition of a continuous, adhering films of polycrystalline diamond on a substrate of electrically nonconducting material, such as silica or sapphire; and at substrate temperatures of 650° C. or less on these and other materials, such as silicon, for which the prior art CVD, although effectively depositing such films, required substantially higher temperatures. Such deposition is carried out by use of the applicants' discovery that initial nucleation of diamond crystallites on and adherent to a substrate is facilitated from a carbon containing vapor activated, as by micro-wave energy, to form a plasma, when the plasma is provided with atoms of a metal and when the substrate is maintained at a positive electric potential relative to a vacuum chamber wall enclosing the plasma. Such a potential of at least about 25 volts and the metals chromium, titanium, and nickel, are particularly effective for the purposes of the present invention.

Once nucleation of diamond crystallites is initiated on a substrate surface in accordance with the present invention, further deposition by growth of these crystallites and additional nucleation on the existing crystallites provides a continuous film adherent to the substrate since, as with crystals in general, more favorable conditions are required for initial nucleation than for growth following nucleation.

Nucleation in accordance with the present invention may be carried out on a relatively thin interlayer provided, as by sputtering, on a base substrate. Use of such an interlayer provides diamond film deposition in accordance with the present invention on materials, such as ordinary glasses and bulk metals, with which the present invention is not directly effective, and accommodates thermal expansion differences between a substrate and a diamond film initially nucleated in accordance with the invention.

In the practice of the present invention, the necessary metal atoms have been provided by a metalorganic compound introduced into the vapor and by solid materials including the substantially pure metal, an alloy of the metal, and an oxide or nitride of the metal. The solid materials are effective when used to construct an open vessel, which is placed in the chamber with the substrate disposed within the vessel, or when coated on a ring within which the substrate is placed. In one particularly advantageous application of the present invention, the solid material is coated on a portion of the substrate surface with the result that, on a nonconducting or semiconducting substrate, a diamond film is selectively deposited only on the uncoated balance of the surface.

With the present invention wherein nucleation of diamond crystallites occurs on nonconducting materials and on semiconducting materials at temperatures below those of the prior art, it is believed that such nucleation is effective when the formation of a negative charge on a substrate surface to be nucleated with diamond is prevented. Such a negative charge inhibits diamond crystallite nucleation and originates from bombardment of the surface by the very high electron population of the carbon containing plasma. It is believed that in prior art deposition on a semiconducting material, such as silicon, the material conducts such a charge away from the surface while the relatively high substrate temperatures of 850°–1100° C. provide thermodynamically favorable conditions for diamond crystal growth. On nonconducting materials, however, the negative charge accumulates so that diamond cannot nucleate even at these elevated temperatures and, even with semiconducting materials, the thermodynamic conditions are not favorable enough at lower temperatures to overcome the negative charge that does accumulate.

However, metal atoms provided in the plasma in accordance with the present invention are present at a surface on which diamond nucleation and deposition are desired and are believed to neutralize or carry off such a negative charge allowing the initiation of diamond crystallites at the surface. Since the metal atoms are too large to enter into the developing diamond crystal lattice, they do not themselves nucleate carbides or other undesired crystalline materials where diamond deposition is desired. The metal atoms are thus required only during initial nucleation of diamond and are, in fact, undesirable at later stages of diamond film deposition where the metal might contaminate a developing film.

When the present invention is carried out by introduction of an organometallic compound such as chromium III trifluoropentane-dionate into the plasma, contamination is prevented in accordance with the present invention by simply stopping the introduction of the compound as soon as sufficient nucleation of diamond crystallites occurs, typically a matter of ten to thirty minutes.

When the present invention is carried out by provision of a solid material containing the desired metal atoms such as chromium, titanium, or nickel effective in the practice of the present invention, the material is juxtapositioned to a surface at which diamond nucleation and subsequent film growth are desired; and these atoms are etched from the surface of the metal containing material by the highly erosive, hydrogen containing plasma when the plasma is first formed and the metal atoms are carried by the plasma to the diamond deposition surface.

If the metal containing material is provided as a relatively thin film, as of about 30Å in thickness, the film etches away shortly after diamond nucleation is initiated on the desired diamond deposition surface so that no further contamination is possible. With thicker solid materials, such as bulk materials and films about 2500Å thick, it has been found that, as soon as diamond crystallite growth begins on such surface, the deposition of carbon soot begins on the metal containing surface from which the metal atoms are being etched and that this soot stops further etching. Surprisingly, the period of time required to stop this etching, as determined by emission spectroscopic examination of the plasma, is substantially the before mentioned period of several tens of minutes required for the initial nucleation of diamond crystallites without contamination of a developing polycrystalline diamond film by further etching. It is believed that this is because metals such as the metals chromium, titanium, and nickel heretofore found most effective in the practice of the present invention, while reactive enough for effective etching by the hydrogen plasma, do not form carbides under the conditions for diamond film deposition typically utilized with the present invention so that carbon is deposited from the plasma in the form of soot as before mentioned.

In any event, examination of polycrystalline diamond films formed by initial nucleation and growth in accordance with the present invention and provided with atoms of a metal from either a metalorganic vapor in the plasma or a solid materials coated on or juxtapositioned to surfaces where the films are deposited, do not show any contamination of the diamond films by the metal when examined by Auger spectroscopy and Rutherford backscattering spectroscopy except at the diamond film substrate interface where the contamination was less that 0.2 atomic weight percent.

The effectiveness of different materials for the practice of the present invention will now be described. Gold has been found ineffective. It is believed that this is because gold, being relatively unreactive, is not etched by the hydrogen plasma. Copper has also been found ineffective, either because it is unreactive or because, not being refractory, it melts without providing atoms to the plasma. Iron is ineffective because iron absorbs carbon and it is believed that carbon from the plasma is absorbed on iron before diamond can nucleate. Thus a ring surrounding a substrate and constructed of cast iron or of stainless steel, an alloy of 70% or more iron with chromium and nickel, were ineffective although inconel, such an alloy with 21-25% chromium and about 20% iron, is effective. The more reactive materials zirconium and molybdenum, although refractory, are also relatively ineffective since they apparently form carbides when exposed to the hydrogen containing plasma rather than being liberated into the plasma as are the known effective metals chromium, titanium, and nickel. It is, therefore, believed that the metal atoms necessary for the practice of the present invention may be provided by any metal which is sufficiently reactive to be etched by hydrogen plasma without excessive carbide formation; which is yet sufficiently refractory to withstand the plasma during initial diamond crystallite nucleation; and which does not absorb so much carbon that such nucleation cannot occur.

It is thus evident that, with the present invention, application of a coating of a suitable metal or metal containing material on a portion of a nonconducting or semiconducting surface will result in diamond nucleation and film growth only on the uncoated remaining region of the surface, most of the coating of metal providing material remaining in place if originally sufficiently thick, as about 2500Å. After diamond deposition is complete, this remaining coating can be removed in any suitable manner, as by acid etching, leaving a diamond film on the originally uncoated region of the surface. As a result, deposition of a metal providing material in regions determined by a mask can provide selective or patterned deposition of diamond films for such applications as integrated circuits.

Aspects of CVD diamond film deposition utilized in the practice of the present invention other than those described above are similar to those of the prior art, for example as set forth in the present applicants' U.S. Pat. No. 5,169,676 which is hereby incorporated by reference. This patent discloses a vacuum chamber and associated apparatus, electrical bias of a substrate in such a chamber relative to a wall thereof, and deposition of a sputtered interlayer.

OBJECTS OF THE INVENTION

It is thus an object of the present invention to provide a method for deposition of a continuous, adhering film of polycrystalline diamond on an electrically non-conducting substrate.

Still another object is to provide a method for deposition of polycrystalline diamond on electrically nonconducting and other substrates at a temperature substantially less than 850° C.

Yet another object is to provide methods such as the above for selective deposition of a film of polycrystalline diamond on portions of a substrate.

DETAILED DESCRIPTION

The present invention provides for significantly improved diamond film quality and growth rate on insulating substrates and thin films. The usual method of abrading the substrate surface with diamond particles yields good quality chemical vapor deposition (CVD) diamond films at reasonable deposition rates on semiconducting materials like silicon. However, on insulating materials like fused silica and sapphire, the conventional method of diamond seeding and surface abrasion almost always results in slow growth rates and poor quality films.

Diamond was grown successfully on these types of materials using a sacrificial metal layer method providing metal induced nucleation of diamond. This method offers a way to deposit diamond on glassy materials with improved adhesion and at lower deposition temperatures of less than 650° C. In addition, the present invention can be used in combination with metal masking and conventional etching to deposit patterns of diamond. The present invention may be combined with sputtered refractory interlayer nucleation techniques to control Diamond-crystallite size and orientation and fabricate low-scatter diamond films.

A reliable, efficient method for growing diamond on insulating materials significantly enhances the feasibility of practical applications of CVD diamond technology as for low-scatter, protective diamond films on sapphire and glass ceramics for visible-wavelength windows and missile domes. For electronic applications, reduction in the growth temperature makes CVD diamond more compatible with existing semiconductor processes. The lower growth temperature also helps to alleviate diffusion problems in metal alloys and facilitates the application of diamond coatings to cutting-tool inserts.

Diamond film growth by microwave-assisted CVD on insulator materials like fused silica is difficult even with seeding. Generally, diamond nucleation is non-uniform and the films are not continuous on insulator materials, and the limited regions of diamond film growth usually peel when cooled to room temperature. The present metal induced nucleation of diamond method promotes continuous, adherent diamond films on refractory metal oxide films like hafnia ($HfO_2$) and on insulating substrates like fused silica, sapphire which is substantially aluminum oxide ($Al_2O_3$), and glass ceramics. The method was discovered when attempts to nucleate diamond on a fused silica substrate half-coated with chromium resulted in diamond film growth only on the uncoated portion of the sample.

One of the ways to implement the present invention involves a thin metal film that acts as a sacrificial agent. Patterning is possible because diamond is deposited only on areas not coated with the metal film. After the deposition, the metal can be removed with an acid etch leaving a patterned-diamond film. Since the metal film is covered rapidly with a non-diamond-carbon "soot", contamination in the diamond from the metal is limited.

Other ways to implement the present invention include placing an object coated with a metal layer or a piece of bulk metal or alloy next to the substrate to be coated with diamond. In addition, the source of the metal can be a metal nitride film like titanium nitride (TiN). An important requirement is that the plasma contacts the source of the metal during the initial stages of diamond growth. To illustrate the importance of the metal during the initial stages of nucleation, diamond films were grown on insulating substrates using metal-organic compounds dissolved in carrier solvents such as chromium III trifluoropentanedionate in acetone which that successfully nucleates diamond on fused silica.

The mechanism for diamond nucleation by the present invention is believed to be the manner in which the vaporized metal in the plasma effects the surface charge on the insulator substrate. A microwave plasma consists of a very high electron population. The electron bombardment can cause charging of the insulator surface. It is believed that the positive metal ions in the plasma neutralize the negative surface charge and provide the right conditions for diamond formation, these conditions being most favorable when the substrate is electrically biased as subsequently described.

In accordance with the present invention, CVD diamond films were grown using microwave-assisted chemical vapor deposition. The Astex microwave reactor system includes a 1.5-kW microwave generator, rf-induction substrate heater, and six computer-controlled mass-flow controllers. The vacuum pumping system consists of a Leybold-Hereaus Trivac B, BCS corrosion-resistant pump with PFPE fluid. Ultimate chamber vacuum is $1\times10^{-4}$ torr. Pressure monitoring and control are accomplished using MKS Baratron capacitance manometers and throttle valve, respectively. Absolute pressure is monitored using a Granville-Phillips convection gauge and a Varian 564 extended-range ionization gauge.

Substrate temperatures were determined by optical-pyrometer measurements and a thermocouple embedded in the heated-substrate stage. Initial experiments used the rf-induction-heated stage to maintain the substrate at 650° C. It later was determined that plasma heating of the substrate alone was adequate to initiate and maintain diamond growth. With the rf-induction heater turned off and the microwave power set at 1100 watts, the thermocouple embedded in the substrate stage indicated a temperature of approximately 400° C. In addition, diamond films were grown successfully with microwave power set between 900 and 1300 watts. Although diamond successfully grew on unabraded surfaces, most of the substrates were abraded prior to deposition to enhance the uniformity of the diamond films.

The total chamber pressure was 45 torr. Methane (in concentrations of 0.5 to 3% in hydrogen) was the hydrocarbon source for the diamond. Oxygen (in concentrations of 0.25 to 1%) was added to the feedstock to lower the graphitic content of the films and to promote diamond growth. The carbon-to-oxygen ratio was kept between 1 and 3. Total gas flow ranged from 200 to 300 sccm.

The metal and metal nitride coatings were reactively sputtered from high-purity-metal targets using a Varian S-gun dc-magnetron sputtering system. Each metal or metal nitride film was deposited to a thickness of 2500 to 4000 Å on a fused silica ring which subsequently was placed around the substrate to be coated with diamond.

The behavior of the metal in the plasma was monitored using emission spectra taken with an EG&G intensified linear diode array and a 0.25-meter Jarrel-Ash monochromator. Raman spectra of the diamond films were measured on a SPEX Triplemate spectrometer using a SPEX CCD array. The 5145-Å-argon-ion line was used for excitation. Laser-spot diameter at the sample surface was approximately 150 µm.

The superiority of the metal induced nucleation of diamond method of the present invention for nucleating and enhancing diamond growth on a diamond abraded, fused silica substrate is shown by deposition of a continuous, uniform, 1.6 µm-thick diamond film after about four hours of deposition although the deposition temperature was less than 650° C. providing a growth rate of about 0.4 µm/hr. The resulting film had a microroughness in the order of a few microns RMS, and could be polished to provide much lower scatter and greater transparency in the visible. The source of the metal was a ring containing chromium and placed around the fused silica substrate. Similar diamond film deposition without metal induced nucleation of diamond in accordance with the present invention resulted in only sparse nucleation of diamond after twelve hours of deposition although the fused silica substrate was diamond abraded prior to deposition and a conventional deposition temperature of about 850° C. was used. The growth rate was difficult to estimate because the film was not continuous, but a best estimate is less than 0.2 µm/hr showing that the present invention provided higher diamond growth rates at the lower deposition temperature.

With the present invention, the best results were obtained when substrates of electrical insulating material and coatings of refractory metal oxide and nitride were diamond-grit abraded prior to diamond deposition as is conventional in CVD diamond deposition on semiconducting substrates. Nucleation and uniformity were higher on the abraded surfaces. Diamond grew on unabraded surfaces but the films contained areas of voids.

Besides placing a metal-containing ring around the substrate, the present invention can be implemented with thin films of metals and metal nitrides deposited directly on the substrate. Half-coated fused silica substrates were prepared using reactive dc-magnetron sputtering to deposit thereon metal-containing films were about 2500 Å thick. Nine materials were used and the quality of the diamond film deposited on the uncoated half of the fused silica substrate was monitored. High-quality, continuous diamond films were obtained using chromium (Cr), chromium nitride (CrN), titanium (Ti), titanium nitride (TiN), and nickel (Ni) films. The resulting diamond crystallites ranged in size from submicron to 10 μm with growth rates varying between 0.25 and 0.5 μm/hr depending on the deposition conditions. Adherence to the insulating substrate was excellent for diamond films up to 5 μm thick. At thicknesses greater than 5 μm, the diamond films delaminated. With copper (Cu) and molybdenum (Mo), diamond nucleated on the bare half of the substrate but with large areas of voids. Only sparse diamond crystallites grew on the bare portion of the substrate half-coated with gold (Au). The effectiveness of the metal-containing films for producing optical-quality diamond ranked from best to worst as follows: Cr, CrN, Ti, TiN, Ni, Mo, Cu, and Au indicating that the present invention is most effective using metals that easily form refractory oxides and carbides while non-reactive metals like gold do not induce nucleation of diamond on insulating substrates.

A Raman spectrum of a diamond film grown using the present invention shows a peak centered at 1331 $cm^{-1}$ with a FWHM of 5.3 $cm^{-1}$ and indicates good optical-quality diamond while the absence of a broad peak in the 1500 $cm^{-1}$ region indicates that the film contains little non-diamond carbon.

Several areas have been explored to discern the mechanism for diamond growth when using metal initiated nucleation of diamond in accordance with the present invention. Plasma emission was monitored in an attempt to determine the role of the metal species. Other areas included a comparison of the such nucleation on electrically insulating, semiconducting and conductive substrates; the use of a sputtered refractory interlayer nucleation technique in combination with the present invention to control diamond crystallite size and orientation; the use of glass ceramic substrates; and the effects of electrically biasing the substrate.

Plasma emission was studied during the deposition of a diamond film in accordance with the present invention on a fused silica substrate, half-coated with a 2500-Å-thick chromium film. Along with the hydrogen-emission lines at 486 and 656 nm, there were two moderately-intense-emission lines at approximately 585 and 670 nm associated with the presence of metal in the plasma. The emission lines do not correspond to any lines for pure chromium, and a literature search of emission from metal-containing species like chromium hydride has not produced conclusive assignments. Time-resolved plasma emission indicates that the metal is present in the plasma in significant quantities only during the first 30 minutes of deposition. It appears that a layer of non-diamond-carbon soot starts to form on the metal film during the first few minutes of deposition, and that the non-diamond carbon prevents further etching of the metal in the later stages of deposition since the plasma-emission lines at 585 and 670 nm are present only when the metal film is being etched by the hydrogen plasma during the first stages of deposition.

Chromium layers were deposited by dc-magnetron sputtering to a thickness of 30 Å on fused silica and single crystal silicon substrates, each substrate being masked so that only half of the surface was coated with chrome. Abraded and non-abraded samples of each substrate material were subjected in separate runs to identical diamond deposition conditions with the substrate temperature at 650° C.

With the electrically nonconducting fused silica material, the 30-Å-thick chrome film nucleated continuous diamond films with small crystallites on both the chrome-coated and bare halves of the abraded fused silica. The non-abraded sample had moderate nucleation density on only the bare fused silica. There was only sparse diamond growth on the non-abraded chrome-coated half. Along with diamond, soot also formed on the chrome-coated halves of the abraded and non-abraded samples. These results indicate that a very thin metal layer about 30 Å thick utilized in accordance with the present invention promotes diamond nucleation on non-abraded and abraded fused silica.

The results for the 30-Å-thick films were slightly different from those discussed previously for 2500-Å-thick films where diamond only nucleated on the bare halves of the fused silica and only non-diamond-carbon soot formed on the chrome-coated side. However and unlike the 2500-Å-thick films, the 30-Å-thick chromium films may not be continuous which may account for the slightly different behavior.

With the electrically semiconducting material silicon, the 30Å thick chrome film on the abraded silicon substrate produced an extremely dense, uniform diamond coating on both the chrome-coated and bare halves. The overall thickness uniformity was somewhat better on the bare silicon than on the chrome-coated half. There were only scattered, large diamond crystallites on both the chrome-coated and bare halves of the non-abraded silicon sample. These results indicate that the present metal induced nucleation of diamond method improves the nucleation density on abraded silicon substrates at low deposition temperatures.

The results show that the substrate material has an important influence on the diamond nucleation density and growth rate. The present invention improves diamond nucleation on most substrate materials when the surfaces are abraded prior to the diamond deposition. However, it appears that the best results occur with more insulating substrates like fused silica.

Diamond films deposited in accordance with the present invention were used with the sputtered refractory interlayer nucleation technique (SPRINT) wherein the diamond is grown on thin interlayer films and diamond-crystallite size and orientation may be controlled. Since diamond films produced by present invention on fused silica have relatively large crystallites and thus high optical scatter which reduces the visible transmission, the use of such interlayer films with diamond nucleated thereon in accordance with the present invention was investigated to see if this combination would produce thick, low-scatter, optical-quality diamond films on crystalline and amorphous materials with improved adhesion and optical scatter relative to diamond films deposited directly on fused silica. Accordingly, thin films of silicon carbide (SiC), silicon nitride ($Si_3N_4$), amorphous hydrogenated silicon (α-Si:H), silicon dioxide ($SiO_2$), hafnia ($HfO_2$), aluminum oxide ($Al_2O_3$), aluminum nitride (AlN), and titanium nitride (TiN) were deposited by dc-magnetron and ion-beam sputtering on fused silica substrates to a thickness of approximately 2500 Å with the fused silica substrates being masked so that only half the surface was coated. These interlayer film and substrate samples were used to determine if diamond could be grown thereon in by metal induced nucleation in accordance with the present invention.

The samples were gently diamond abraded prior to diamond deposition and coated in separate runs under identical diamond deposition conditions with the substrate temperature at 650° C. and with the present invention implemented by a metal-containing ring placed around each sample. Continuous diamond films grew on all the above listed thin-film materials* which ranked, in order of best to worst nucleation density: $SiO_2$, $HfO_2$, SiC, AlN, TiN $Si_3N_4$ $Al_2O_3$, and α-Si:H; however, only the diamond films on the $SiO_2$, $HfO_2$, SiC, and AlN films did not delaminate to some extent upon cool down. The lowest scatter diamond films were grown on the nitride and carbide films.

The present invention was utilized with substrates of a glass ceramic identified as "TRC-5", which is manufactured by the Ohara Corporation of Somerville, N.J., and on which diamond film deposition in accordance with prior art CVD is ineffective. This glass ceramic is a visible to mid-infrared transmitting material having optical transmission similar to sapphire and having a chemical composition consisting of $SiO_2$, $Al_2O_3$, and ZnO. It is believed that, with prior art diamond deposition temperatures greater than 850° C. and in the presence of the hydrogen plasma, the zinc oxide decomposes and the metal migrates to the surface where the presence of zinc metal at the surface effectively stops diamond growth. With the present invention, however, the deposition temperature is kept below 650° C. preventing such zinc migration and allowing diamond nucleation and film growth. Nomarski micrograph examination of a diamond film grown on the TRC-5 material in accordance with the present invention shows diamond morphology similar to that of diamond films grown on fused silica and other insulating materials in accordance with this invention, and it is believed that the present invention may be thus be applied to other glass ceramics containing metal oxides.

The effect of an electrical potential bias between a substrate, on which diamond nucleation and growth occurs in accordance with the present invention, and the wall of a vacuum chamber, which contains the substrate and a plasma contacting the substrate and activated by microwave energy from a mixture of hydrogen and methane, was investigated to determine changes in the etch rate of the metal by the plasma and in the diamond nucleation and growth rate due to variations in the bias.

DC voltages between −400 and +400 volts were applied to the substrate stage, the sign indicating the relative potential of the substrate to the wall. Application of positive voltages of less than 25 volts had little affect, and the highest diamond-nucleation densities were obtained on fused silica and silicon with bias voltages between +80 and +100 volts. Emission spectra like those described above showed that the positive voltages had only a slight effect on the metal film etch rate. However, when a negative bias less than −25 volts was applied, the metal film etching stopped instantly and only sparse diamond crystallites grew on either fused silica or silicon substrates. It is thus evident that, in the practice of the present invention, electrical biasing of the substrate relative to the vacuum chamber wall provides a way to control diamond nucleation density and growth.

A particularly significant use of the present invention is to deposit CVD diamond films disposed in predetermined patterns on electrically insulating materials. To deposit one such pattern, a non-woven, 70-line-per-inch, electrolytic-nickel screen with 15-μm-diameter grid lines was placed over a diamond-abraded fused silica substrate so that the nickel grid would provide a source of metal to initiate the nucleation and growth of diamond films during CVD diamond deposition in accordance with the present invention. Following such deposition for four hours, "square" patterns of diamond had been deposited between the nickel-grid lines on the fused silica and were examined by Nomarski micrograph examination. It was found that diamond only grew on the bare fused silica and that there was no diamond growth observed under the nickel-grid lines. The residual nickel screen can be removed by a hydrochloric-nitric-acid etch leaving the CVD diamond in the desired pattern. However, the nickel grid lines can be cleaned with a mild etch and left in place for uses, such as flat-panel displays, needing a conducting, patterned-diamond structure. It is evident that this patterning method need not be restricted to planar substrates and may use metal masks deposited by integrated circuit techniques so that the present invention has been used to construct tubular diamond elements, such as gas channels for cryostats and to construct diamond structures such as precisely patterned cold cathodes and heat sinks for electronics.

It is evident from the foregoing that continuous, uniform, optical-quality diamond films can be produced on insulating substrates in accordance with the present invention by providing a sacrificial source of metal for inducing diamond nucleation. Growth rates and nucleation densities are similar to those obtained on semiconducting substrates like silicon with the higher temperature deposition processes of the prior art. The present invention may thus avoid difficulties associated with prior art diamond CVD deposition and due to thermal expansion mismatch, metal diffusion in sintered carbide tool inserts and glass ceramics, and thermal decomposition of materials like ZnS and ZnSe.

In the present invention, contamination from the metal is limited to the very earliest stages of diamond nucleation. As before stated, very thin metal films, such as those less than 30 Å thick, are consumed very quickly by the plasma while with thicker films and metal-containing objects, a layer of "soot" forms rapidly and protects the underlying metal from further etching by the plasma and the mechanism is supported by emission spectra taken during the diamond deposition which shows metal species are present in the plasma only during the initial stages of growth. Preliminary Auger spectroscopy and Rutherford backscattering spectrometry (RBS) indicate less than 0.2 atomic weight percent of metal contamination at the substrate/diamond film interface although secondary ion mass spectroscopy (SIMS) depth-profiling measurements are needed to confirm even lower low levels of metal contamination at the interface and through the bulk of the diamond film.

Also as before stated in the practice of the present invention, the hydrogen plasma must be in contact with the source of the metal which can be a thin film on the substrate or a metal containing object adjacent to the substrate and the need not be a pure metal, can be a metal nitride, oxide, carbide, or alloy. Metals that easily form refractory compounds appear to produce the best results while non-reactive metals like gold are very ineffective. The effectiveness of metals for initially nucleating and then growing optical quality diamond films ranked from best to worst as follows: chromium, chrome nitride, titanium, titanium nitride, nickel, molybdenum, copper, and gold.

As described above, the present invention is not limited to diamond deposition directly on insulating and semiconducting substrates, but is effective to deposit diamond on sputtered interlayers constructed of thin films of refractory compounds like $SiO_2$, $HfO_2$, SiC, and AlN. Such a thin film improves is effective as a graded thermal expansion interlayer to improve the adhesion of diamond to a substrate. Such a sputtered interlayer is also effective as a diffusion barrier on cutting tool inserts and glass ceramics to prevent free metals at the substrate surface from suppressing diamond nucleation. In conjunction with the low temperature aspect of the present invention, such sputtered refractory interlayers might be used to encapsulate materials to be coated with diamond by CVD and thereby prevent the materials from decomposing in the hydrogen plasma so that diamond films may be grown on long wavelength infrared window and dome materials like ZnS and ZnSe.

It appears from the above-described patterned deposition of patterned diamond in accordance with the present invention, that this invention may be used to deposit adherent, high-quality diamond films on insulating substrates or dielectric layers as required for incorporation of CVD diamond into current semiconductor fabrication processes and architecture; and it appears that metal initiated nucleation of diamond in accordance with the present invention may provide CVD diamond technology for other and presently completely novel electronic and optical applications.

EXAMPLES

In these examples, well-known techniques and materials were used as follows:

Substrates were cleaned prior to sputtering deposition by first scrubbing with deionized water and detergent solution, then rinsing several times in deionized water with a final rinse in spectroscopic grade methanol. Finally, the substrate was drag wiped with methanol as the final step.

Chromium metal films were reactively sputtered in a DC magnetron system from a 99.999% purity chromium target. Total gas pressure was 2 millitorr of pure argon. Forward power was 0.5 kilowatts giving a deposition rate of 60 Å/min. The substrates were unheated. Film thickness was 2500 Å.

Titanium metal films were similarly reactively sputtered to a thickness of 2500 Å in a DC magnetron system from a 99.999% purity titanium target.

Chromium nitride films were made in a IonTech ion beam sputtering system from 99.995% purity chromium target. Total gas pressure was $3 \times 10^{-4}$ torr of pure nitrogen. Ion energy in the beam was 1000 eV with a beam current of 45 milliamps. Deposition rate was 30 Å/min. Film thickness was 2500 Å.

Hafnium oxide films were made in a Ion Tech beam sputtering system from 99.95% purity hafnium metal target. Total gas pressure was $3 \times 10^{-4}$ torr of pure oxygen. Ion energy in the beam was 1000 eV with a beam current of 45 milliamps. Deposition rate was 30 Å/min and the film thickness was 2500 Å.

Nickel metal films with a thickness of 2500 Å were also deposited in an Ion Tech ion beam sputtering system from a 99.999% purity nickel target in pure argon.

Silicon nitride films were deposited in a Perkin-Elmer Randex RF diode sputtering system using a 99.999% purity silicon target, a gas mixture of argon and nitrogen with a total gas pressure of 2 millitorr, and a forward RF power of 600 Watts. In all cases the substrate was unheated. The silicon nitride film thickness was 500- to 2500-Å.

The inconel alloy 601, molybdenum, nickel, and zirconium crucible covers were obtained from B-J Scientific Products, Inc. of Albany, Oreg. and each had an overall diameter of 2.375", lip width of 0.375", depth 0.125", and thickness of 0.35". The chemical composition, %, of the inconel alloy 601 is:

| Nickel | 58.0–63.0 |
| Chromium | 21.0–25.0 |
| Iron | Remainder |

-continued

| Aluminum | 1.0–1.7 |
| Carbon | 0.10 max |
| Manganese | 1.0 max |
| Sulfur | 0.015 max |
| Silicon | 0.50 max |
| Copper | 1.0 max |

The chromium III trifluoropentane-dionate (CTFPD), $C_{15}H_3F_9O_6Cr$, was obtained from Gelest, Inc. of Tullytown, Pa., had a molecular weight of 511.24, and was soluble in toluene, acetone and hot ethanol. A 1.0 Molar solution of the CTFPD in spectroscopic grade acetone was used.

The chlorodifluoromethane, $CHClF_2$, was obtained from Chemtronics, Inc. of Kennesaw, Ga.

The saturated boron trioxide solution in methanol utilized 99.98% pure boron trioxide obtained from Johnson Matthey Company of Ward Hill, Mass.

The saturated phosphorous pentoxide solution in methanol utilized 99.95% pure, phosphorous pentoxide obtained from Johnson Matthey Company of Ward Hill, Mass.

Example 1

A 1.0-inch-diameter fused silica substrate was used and was not diamond abraded prior to diamond deposition. The diamond film deposition parameters were:

Forward Microwave Power: 900 Watts

Reflected Microwave Power: <1 Watt

Hydrogen Flow Rate: 186.3 sccm

Methane Flow Rate: 2.5 sccm

Oxygen Flow Rate: 0.85 sccm

Reactor Total Pressure: 45 torr

Substrate Temperature: 650° C.

Total Deposition Time: 4 hours

The substrate was brought up to temperature (650° C.) and was vacuum pumped on for 20 minutes. The hydrogen was introduced into the chamber and the chamber pressure was set to 15 torr. Once the chamber reached 15 torr, the microwave power was turned on (700 Watts) to initiate the plasma ball. The pressure was than adjusted to 45 torr and the microwave power to 900 Watts. The microwave tuning stubs were adjusted to minimize reflected microwave power. The methane and oxygen were added to the feedstock and the deposition continued for 4 hours.

After the 4 hour deposition, the methane and oxygen feeds were turned off. The hydrogen only plasma was allowed to run to 15 minutes. The microwave and substrate heater power were then turned off and the substrate allowed to cool to room temperature. There were a few, random diamond crystallites of about 2 to 5 micron diameter on the edge of the fused silica substrate and some in large polishing scratches in the center. The majority of the central area did not have any diamond crystallites.

Example 2

1.0-inch-diameter optical quality fused silica substrate was used. The substrate was polished with 0 to 0.5 micron synthetic diamond grit for 20 minutes and washed clean with methanol prior to diamond deposition. The diamond film deposition parameters were again:

Forward Microwave Power: 900 Watts

Reflected Microwave Power: <1 Watt

Hydrogen Flow Rate: 186.3 sccm

Methane Flow Rate: 2.5 sccm

Oxygen Flow Rate: 0.85 sccm

Reactor Total Pressure: 45 torr

Substrate Temperature: 650° C.

Total Deposition Time: 4 hours

The substrate was brought up to temperature (650° C.) and was vacuum pumped on for 20 minutes. The hydrogen was introduced into the chamber and the chamber pressure was set to 15 torr. Once the chamber reached 15 torr the microwave power was turned on (700 Watts) to initiate the plasma ball. The pressure was than adjusted to 45 torr and the microwave power to 900 Watts. The microwave tuning stubs were adjusted to minimize reflected microwave power. The methane and oxygen were added to the feedstock and the deposition continued for 4 hours.

After the 4 hour deposition, the methane and oxygen feeds were turned off. The hydrogen only plasma was allowed to run to 15 minutes. The microwave and substrate heater power were then turned off and the substrate allowed to cool to room temperature.

There were large diamond crystallites of about 1 to 2 microns diameter scattered around the edge of the substrate. Few random crystallites were present in the central area. Several large scratches had scattered diamond crystallites in them. The results were thus substantially the same as example 1.

Example 3

A 1.5-inch-diameter fused silica substrate was used and was half-coated with chromium metal with the other half left bare. The substrate was not diamond abraded prior to diamond deposition. The diamond film deposition parameters were again:

Forward Microwave Power: 900 Watts

Reflected Microwave Power: <1 Watt

Hydrogen Flow Rate: 186.3 sccm

Methane Flow Rate: 2.5 sccm

Oxygen Flow Rate: 0.85 sccm

Reactor Total Pressure: 45 torr

Substrate Temperature: 650° C.

Total Deposition Time: 4 hours

Diamond Growth Rate: 0.35 µm/hr

Diamond Film Thickness: 1.5 µm

The substrate was brought up to temperature (650° C.) and was vacuum pumped on for 20 minutes. The hydrogen was introduced into the chamber and the chamber pressure was set to 15 torr. Once the chamber reached 15 torr, the microwave power was turned on (700 Watts) to initiate the plasma ball. The pressure was than adjusted to 45 torr and the microwave power to 900 Watts. The microwave tuning stubs were adjusted to minimize reflected microwave power. The methane and oxygen were added to the feedstock and the deposition continued for 4 hours.

After the 4 hour deposition, the methane and oxygen feeds were turned off. The hydrogen only plasma was allowed to run to 15 minutes. The microwave and substrate heater power were then turned off and the substrate allowed to cool to room temperature. A continuous, white-in-color diamond film had nucleated and grown on the bare part of the fused silica substrate. The diamond film thickness averaged to be 1.5 microns, with crystallite diameter ranging from submicron to 2 microns in diameter. Only sparse, random diamond crystallites were present on the plasma etched chrome film. These crystallites probably grew where there were pinholes in the chromium layer.

Example 4

A 1.5-inch-diameter fused silica substrate was used and was half-coated with chromium metal with the other half left bare. The substrate was not diamond abraded prior to diamond deposition.

The diamond deposition conditions were the same as Example 3 except a positive 25 volt bias was applied to the substrate. Diamond nucleation density remained as in example 3 for the bare fused silica side.

Example 5

A 1.5-inch-diameter fused silica substrate was used and was half-coated with chromium metal with the other half left bare. The substrate was not diamond abraded prior to diamond deposition.

Diamond deposition conditions the same as Example 1 except a negative 25 volt bias was applied to the substrate. Diamond did not nucleate on the bare fused silica and the etching rate on the chromium layer was significantly reduced.

Example 6

A 1.5-inch-diameter fused silica substrate was used and was half-coated with chromium nitride with the other half left bare. The substrate was not diamond abraded prior to diamond deposition.

Diamond deposition conditions were the same as example 1. Results were the same as example 1.

Example 7

1.0-inch-diameter fused silica substrate was diamond abraded with 0–0.25 micron grit for 5 minutes. The substrate was then rinsed clean with distilled water and wiped dry with lens tissue. The fused silica substrate was placed in the center of a crucible cover made of inconel alloy 601. Ten mil thick fused silica shims were used to adjust the height of the fused silica substrate to the crucible rim.

Diamond deposition conditions were the same as example 1, except the substrate heater was not used. The substrate was heated only by the microwave plasma. The substrate holder thermocouple indicated a bulk temperature of 402° C. However, the substrate surface could have been up to 100° C. higher.

After 4 hours, a continuous, white, polycrystalline coating was deposited on the bare fused silica substrate. The coating thickness was measured to be approximately 2.0 microns thick.

The crucible cover had a coating of black soot material on the rim. This was removed with water and an abrasive pad. The crucible cover could then be used again.

Example 8

1.5-inch-diameter fused silica substrate was half coated with 2500 Å of hafnium oxide and then half-coated at a right angle with a 2500 Å thick layer of chromium metal over the substrate and the hafnium oxide so that there was a bare fused silica quarter and a hafnium oxide coated fused silica quarter. These quarters were diamond abraded with 0–0.25 micron diamond grit solution for five minutes prior to diamond deposition, and the substrate was rinsed clean with distilled water and dried with lens tissue. Diamond deposition conditions were the same as in example 1.

The results were like those of example 3 in that diamond nucleated and formed a continuous coating on the hafnium oxide coated fused silica quarter and on the bare fused silica quarter but not on the chromium layer. There were some areas of delamination of the diamond.

Example 9

1.5-inch-diameter fused silica substrate was coated with 2500 Å of silicon nitride and than half-coated with 2500Å of chromium metal. The silicon nitride coated fused silica side was diamond abraded with 0–0.25 micron diamond grit solution for five minutes prior to diamond deposition. The substrate was rinsed clean with distilled water and dried with lens tissue. Diamond deposition conditions were the same as in example 1.

Diamond did nucleate and form a continuous film on the silicon nitride coated fused silica.

However, the diamond crystallites were an order of magnitude smaller than on fused silica. Since the optical scatter was reduced by the small crystallite size, the diamond film was transparent in the visible.

Example 10

A 1.0-inch-diameter fused silica substrate was diamond abraded with 0–0.25 micron grit for 5 minutes. The substrate was then rinsed clean with distilled water and wiped dry with lens tissue.

The diamond deposition conditions were the same as in example 1 including substrate heating to 650° C. except that the methane flow rate was reduced to 1.5 sccm and that 1.0 sccm of the 1 molar solution chromium (III) trifluoropentanedionate in acetone vapor was added.

The addition of the chromium containing fluorinated hydrocarbon increased the microwave plasma temperature.

Diamond nucleated and formed a continuous coating in a ring around the edge of the substrate. The ring width was approximately 0.25". The center of the fused silica substrate had sparse random diamond crystallites indicating that at the center the plasma was hotter than at the edge and too hot for diamond to nucleate.

Example 11

1.0-inch-diameter fused silica substrate was diamond abraded with 0–0.25 micron grit for 5 minutes. The substrate was then rinsed clean with distilled water and wiped dry with lens tissue.

The diamond deposition conditions were the same as in example 1 except that the methane flow rate was reduced to 1.5 sccm and 1.0 sccm of chlorodifluoromethane vapor was added and that the substrate heater was not used.

Results were similar to example 2. The addition of the fluorinated hydrocarbon, which did not contain metal, did not increase the diamond nucleation density or growth.

Example 12

1.0-inch-diameter fused silica substrate was diamond abraded with 0–0.25 micron grit for 5 minutes. The substrate was then rinsed clean with distilled water and wiped dry with lens tissue.

The diamond deposition conditions were the same as in example 10 except that the methane flow rate was reduced to 1.5 sccm and 1.0 sccm of the 1 molar solution chromium (III) trifluoropentanedionate in acetone vapor was added as in example 10.

Unlike example 10, the substrate heater was not used. However, the addition of the fluorinated hydrocarbon increased the microwave plasma temperature and the substrate holder thermocouple indicated a bulk temperature of 645° C. so that the substrate surface temperature could have been much higher.

The results were similar to example 10 in that diamond nucleated and formed a continuous coating in a ring around the edge of the substrate with the ring width being approximately 0.25" and the center of the fused silica substrate having sparse random diamond crystallites thus indicating that active cooling of the substrate would be necessary for the formation of a uniform diamond coating on the substrate.

Example 13

1.0-inch-diameter fused silica substrate was diamond abraded with 0–0.25 micron grit for 5 minutes. The substrate was then rinsed clean with distilled water and wiped dry with lens tissue.

The diamond deposition conditions were the same as in example 1 except that the methane flow rate was reduced to 1.5 sccm and 1.0 sccm of the 1 molar solution chromium (III) trifluoropentanedionate in acetone vapor was added, the microwave power was reduced to 800 Watts and the substrate heater was not used.

The reduced microwave power resulted in a cooler substrate temperature of 543° C., as indicated by the substrate heater thermocouple.

Diamond nucleated and formed a continuous coating across the entire substrate. However, the coating in the center portion was slightly thinner than the edge.

Example 14

All conditions were the same as example 7, except the fused silica substrate was not diamond grit abraded prior to the deposition.

Diamond did nucleate and grow over the entire surface of the fused silica. However, the nucleation density was lighter and there were some bare spots. The film color and crystallite size were the same as example 7.

Example 15

All conditions were the same as example 7, except the inconel alloy crucible cover was replaced by a molybdenum crucible cover.

After 8 hours, only sparse nucleation had occurred on the edge of the fused silica substrate and along large polishing scratches near the center. The molybdenum surface had changed from a dull gray to a dark gold color. This indicates the presence of molybdenum carbide formation. The molybdenum cover was not pitted from the hydrogen plasma as was the inconel cover, which is believed to be why molybdenum was not as effective in stimulating diamond nucleation as the inconel, chromium or nickel.

Example 16

All conditions were the same as example 7, except the inconel alloy crucible cover was replaced by a nickel crucible cover.

Results were very similar to example 7. A white, continuous diamond film had nucleated and grown across the entire fused silica substrate. There was a slight difference in crystallite size. The nickel crucible produced slightly large diamond crystallites. This means that the nucleation density was lighter.

Example 17

All conditions the same as example 7, except the inconel alloy crucible cover was replaced by a zirconium crucible cover.

Resulting nucleation density was less than the inconel or the nickel. There were small bare spots across the silica surface. Large polishing scratches had continuous films down their length.

Example 18

All conditions the same as example 3, except the fused silica was diamond abraded with 0 to 0.25 synthetic diamond grit prior to deposition. A mask was placed over the silica substrate prior to the chromium deposition. The mask protected parts of the silica from being coated with chromium. The mask was removed prior to the diamond deposition.

Diamond nucleated and grew only in the protected areas. The remaining chromium film was etched away with dilute nitric acid solution. This left a diamond pattern on the fused silica surface.

Example 19

1.0-inch-diameter fused silica substrate was diamond abraded with 0–0.25 micron grit for 5 minutes. The substrate was then rinsed clean with distilled water and wiped dry with lens tissue. The fused silica substrate was placed in the center of a crucible cover made of inconel alloy 601. Ten mil thick fused silica shims were used to adjust the height of the fused silica substrate to the crucible rim.

Diamond deposition conditions were the same as example 1, except the substrate heater was not used and the methane flow rate was reduced to 1.5 sccm and the vapor from the $B_2O_3$/methanol solution flow rate was 1.0 sccm. The substrate was heated only by the microwave plasma. The substrate holder thermocouple indicated a bulk temperature of 402° C. However, the substrate surface could have been up to 100° C. higher.

After 4 hours, a continuous, polycrystalline diamond coating was deposited on the bare fused silica substrate. The coating thickness was measured to be approximately 2.0 microns thick. This coating had a slight blue color, indicating the presence of boron. Subsequent SIMS measurements indicate a concentration of boron to be 1000 to 1200 ppm.

The diamond coating was fully electrically conductive. The sheet resistance was measured at 125 ohm-cm (resistivity of ~$10^5$ ohms), while the sheet resistance of undoped diamond films made in this manner could not be measured, indicating a resistivity of greater than $10^{14}$ ohms for undoped material.

Example 20

1.0-inch-diameter fused silica substrate was diamond abraded with 0–0.25 micron grit for 5 minutes. The substrate was then rinsed clean with distilled water and wiped dry with lens tissue. The fused silica substrate was placed in the center of a crucible cover made of inconel alloy 601. Ten mil thick fused silica shims were used to adjust the height of the fused silica substrate to the crucible rim.

Diamond deposition conditions were the same as example 1, except the substrate heater was not used and the methane flow rate was reduced to 1.5 sccm and the vapor from the $P_3O_5$/methanol solution flow rate was 1.0 sccm. The substrate was heated only by the microwave plasma. The substrate holder thermocouple indicated a bulk temperature of 410° C. However, the substrate surface could have been up to 100° C. higher.

After 4 hours, a continuous, white, polycrystalline diamond coating was deposited on the bare fused silica substrate. The coating thickness was measured to be approximately 2.0 microns thick. Subsequent SIMS measurements indicate a concentration of phosphorous to be 400 to 450 ppm.

The diamond coating was electrically conductive with a sheet resistance measured at 4600 ohm-cm (resistivity of ~$10^7$ ohms). The sheet resistance of undoped diamond films made in this manner could not be measured indicating a resistivity of greater than $10^{14}$ ohms for undoped material.

Example 21

A 1.0 inch diameter, 10 mil thick, <100> single crystal silicon substrate was diamond abraded with 0–25 micron diamond grit for 10 minutes. The substrate was then rinsed clean with distilled water and wiped dry with lens tissue.

The diamond deposition conditions were the same as example 1. There were no metal coatings or bulk metal crucibles present. The substrate temperature was maintained at 650° C. with the rf induction heater.

After the 4 hour deposition, there were large diamond crystallites of about 1–2 micron diameter scattered around the edge of the substrate and a few random crystallites were present in the central area so that the results were substantially the same as in example 1.

Example 22

A 1.0 inch diameter, 10 mil thick, <100> single crystal silicon substrate was diamond abraded with 0–0.25 micron diamond grit for 10 minutes. The substrate was then rinsed clean with distilled water and wiped dry with lens tissue.

The silicon substrate was placed in the center of a crucible cover made of inconel alloy 601, and a 0.125 inch silica disk was placed underneath the silicon substrate to adjust the height of the silicon to the crucible rim.

Diamond deposition conditions were the same as example 21 with the substrate temperature being maintained at 650° C. with the rf induction heater. However, after 4 hours at this same substrate temperature and also with the inconel alloy element, a continuous, light gray, polycrystalline diamond coating was deposited on the silicon substrate. The coating thickness was approximately 1.0 micron.

Example 23

This example was similar to example 3 except that the fused silica substrate was half-coated with a film of nickel metal instead of with chromium metal, the other half of the substrate again being left bare and the substrate not being diamond abraded prior to diamond deposition. The diamond film deposition parameters and procedure were as in example 3 and the results were similar in that a continuous, white-in-color diamond film nucleated and grew on the bare part of the fused silica substrate while only sparse, random diamond crystallites were present on the plasma etched film of nickel metal.

Example 24

This example was similar to example 3 except that the fused silica substrate was half-coated with a film of titanium metal instead of with chromium metal, the other half of the substrate again being left bare and the substrate not being diamond abraded prior to diamond deposition. The diamond film deposition parameters and procedure were as in example 3 and the results were similar in that a continuous, white-in-color diamond film nucleated and grew on the bare part of the fused silica substrate while only sparse, random diamond crystallites were present on the plasma etched film of titanium metal.

Obviously, many modifications and variations of the present invention are possible in light of the above teachings. It is, therefore, to be understood that the present invention may be practiced within the scope of the following claims other than as described herein.

What is claimed is:

1. A method of diamond deposition comprising:

constructing a substrate having a surface;

placing said substrate within a reaction chamber having a wall;

providing said chamber with a mixture of hydrogen and a gas containing carbon;

activating said mixture so as to provide a plasma in contact with said surface; and providing said plasma with atoms of a metallic element by disposing a solid substance including said metallic element in said chamber and in juxtapositioned relation to said surface so that said solid substance is etched by said plasma so as to liberate said atoms of a metallic element into said plasma and so that diamond crystallites nucleate on said surface from said plasma and a continuous, adherent film of polycrystalline diamond grows on said surface from said crystallites.

2. The method of claim 1 wherein said solid substance including said metallic element is selected from the group consisting of said metallic element in a substantially pure state, an alloy of said metallic element, an oxide of said metallic element, and a nitride of said metallic element.

3. The method of claim 1 wherein said plasma is provided with said atoms of said metallic element by coating a portion of said surface with said solid substance including said metallic element before activating said mixture to provide said plasma.

4. The method of claim 1 wherein:

said plasma is provided with said atoms of said metallic element by coating a first portion of said surface with said solid substance including said metallic element before activating said mixture to provide said plasma; and a second portion of said surface is not coated with said solid material, so that said film of polycrystalline diamond forms on said second portion of said surface and so that substantially no diamond crystallites nucleate on said first portion of said surface and said film of polycrystalline diamond does not grow on said first portion of said surface.

5. The method of claim 1 wherein said plasma is provided with said atoms of said metallic element by constructing an open vessel of said solid substance including said metallic element and placing said vessel in said chamber with said substrate disposed in said vessel.

6. The method of claim 1 wherein said substrate is a first substrate and wherein said plasma is provided with said atoms of said metallic element by coating a second substrate of annular configuration with said solid substance, and placing said second substrate in said chamber in circumscribing relation to said first substrate before activating said mixture to provide said plasma.

7. A method of diamond deposition comprising:

constructing a substrate having a surface of an electrically non-conducting material;

placing said substrate within a reaction chamber having a wall;

providing said chamber with a mixture of hydrogen and a gas containing carbon; and activating said mixture so as to provide a plasma in contact with said surface while maintaining said substrate at a positive electric potential relative to said wall, and providing said plasma with atoms of a metallic element by disposing a solid substance including said metallic element in said chamber and in juxtapositioned relation to said surface so that said atoms of said metallic element in said plasma are adjacent to said surface and so that diamond crystallites nucleate on said surface from said plasma and a continuous and adherent layer of polycrystalline diamond grows on said surface from said crystallites.

8. The method of claim 7 wherein said solid substance including said metallic element is selected from the group consisting of said metallic element in a substantially pure state, an alloy of said metallic element, an oxide of said metallic element, and a nitride of said metallic element.

9. The method of claim 7 wherein said plasma is provided with said atoms of said metallic element by coating a portion of said surface with said solid substance including said metallic element before providing said chamber with said mixture.

* * * * *